United States Patent
Komatsu et al.

(10) Patent No.: US 8,426,295 B2
(45) Date of Patent: Apr. 23, 2013

(54) MANUFACTURING METHOD OF MICROCRYSTALLINE SILICON FILM AND MANUFACTURING METHOD OF SEMICONDUCTOR DEVICE

(75) Inventors: Ryu Komatsu, Isehara (JP); Yasuhiro Jinbo, Atsugi (JP); Hidekazu Miyairi, Atsugi (JP); Yoshitaka Yamamoto, Osaka (JP)

(73) Assignees: Semiconductor Energy Laboratory Co., Ltd., Atsugi-shi, Kanagawa-ken (JP); Sharp Kabushiki Kaisha, Osaka-shi, Osaka (JP)

( * ) Notice: Subject to any disclaimer, the term of this patent is extended or adjusted under 35 U.S.C. 154(b) by 21 days.

(21) Appl. No.: 13/267,257

(22) Filed: Oct. 6, 2011

(65) Prior Publication Data

US 2012/0100675 A1    Apr. 26, 2012

(30) Foreign Application Priority Data

Oct. 20, 2010    (JP) .................... 2010-235723

(51) Int. Cl.
*H01L 21/336* (2006.01)
(52) U.S. Cl.
USPC .............. 438/485; 438/494; 257/E21.094
(58) Field of Classification Search .......... 438/485, 438/494; 257/E21.094
See application file for complete search history.

(56) References Cited

U.S. PATENT DOCUMENTS

| | | |
|---|---|---|
| 4,409,134 A | 10/1983 | Yamazaki |
| 5,453,858 A | 9/1995 | Yamazaki |
| 5,514,879 A | 5/1996 | Yamazaki |
| 5,571,578 A | 11/1996 | Kaji et al. |
| 5,582,880 A | 12/1996 | Mochizuki et al. |
| 5,591,987 A | 1/1997 | Yamazaki et al. |

(Continued)

FOREIGN PATENT DOCUMENTS

| | | |
|---|---|---|
| EP | 0535979 A2 | 4/1993 |
| JP | 04-242724 A | 8/1992 |

(Continued)

OTHER PUBLICATIONS

Lee.C et al., "Postdeposition Thermal Annealing and Material Stability of 75° C Hydrogenated Nanocrystalline Silicon Plasma-Enhanced Chemical Vapor Deposition Films ," J. Appl. Phys.(Journal of Applied Physics), Aug. 4, 2005, vol. 98, pp. 034305-1-034305-7.

(Continued)

*Primary Examiner* — Trung Q Dang
(74) *Attorney, Agent, or Firm* — Eric J. Robinson; Robinson Intellectual Property Law Office, P.C.

(57) ABSTRACT

To provide a manufacturing method of a microcrystalline silicon film having both high crystallinity and high film density. In the manufacturing method of a microcrystalline silicon film according to the present invention, a first microcrystalline silicon film that includes mixed phase grains is formed over an insulating film under a first condition, and a second microcrystalline silicon film is formed thereover under a second condition. The first condition and the second condition are a condition in which a deposition gas containing silicon and a gas containing hydrogen are used as a first source gas and a second source gas. The first source gas is supplied under the first condition in such a manner that supply of a first gas and supply of a second gas are alternately performed.

18 Claims, 9 Drawing Sheets

U.S. PATENT DOCUMENTS

| | | | |
|---|---|---|---|
| 5,614,732 | A | 3/1997 | Yamazaki |
| 5,648,293 | A | 7/1997 | Hayama et al. |
| 5,677,236 | A | 10/1997 | Saitoh et al. |
| 5,701,167 | A | 12/1997 | Yamazaki |
| 5,849,601 | A | 12/1998 | Yamazaki |
| 5,859,445 | A | 1/1999 | Yamazaki |
| 6,011,277 | A | 1/2000 | Yamazaki |
| 6,023,075 | A | 2/2000 | Yamazaki |
| 6,153,893 | A | 11/2000 | Inoue |
| 6,252,249 | B1 | 6/2001 | Yamazaki |
| 6,265,288 | B1 | 7/2001 | Okamoto et al. |
| 6,271,055 | B1 | 8/2001 | Yajima et al. |
| 6,281,520 | B1 | 8/2001 | Yamazaki |
| 6,306,213 | B1 | 10/2001 | Yamazaki |
| 6,344,420 | B1 | 2/2002 | Miyajima et al. |
| 6,468,839 | B2 | 10/2002 | Inoue |
| 6,737,676 | B2 | 5/2004 | Yamazaki |
| 6,855,621 | B2 | 2/2005 | Kondo et al. |
| 7,067,844 | B2 | 6/2006 | Yamazaki |
| 7,098,479 | B1 | 8/2006 | Yamazaki |
| 7,115,902 | B1 | 10/2006 | Yamazaki |
| 7,551,655 | B2 | 6/2009 | Tanaka et al. |
| 7,576,360 | B2 | 8/2009 | Yamazaki |
| 7,833,845 | B2 | 11/2010 | Yamazaki et al. |
| 2009/0002591 | A1 | 1/2009 | Yamazaki et al. |
| 2009/0033818 | A1 | 2/2009 | Nakajima et al. |
| 2009/0047759 | A1 | 2/2009 | Yamazaki et al. |
| 2009/0057683 | A1 | 3/2009 | Nakajima et al. |
| 2009/0061574 | A1 | 3/2009 | Nakajima et al. |
| 2009/0072237 | A1 | 3/2009 | Yamazaki et al. |
| 2009/0200552 | A1* | 8/2009 | Won et al. .................. 257/57 |
| 2010/0216285 | A1 | 8/2010 | Yokoi et al. |
| 2011/0039402 | A1 | 2/2011 | Yamazaki et al. |
| 2011/0059562 | A1 | 3/2011 | Yamazaki et al. |
| 2011/0278582 | A1 | 11/2011 | Tezuka et al. |
| 2012/0003787 | A1* | 1/2012 | Tanaka et al. .................. 438/96 |
| 2012/0034765 | A1* | 2/2012 | Miyairi et al. ................ 438/481 |

FOREIGN PATENT DOCUMENTS

| | | | |
|---|---|---|---|
| JP | 05-129608 A | 5/1993 | |
| JP | 05-275346 | 10/1993 | |
| JP | 06-077483 A | 3/1994 | |
| JP | 07-045833 A | 2/1995 | |
| JP | 07-131030 A | 5/1995 | |
| JP | 07-162003 A | 6/1995 | |
| JP | 07-211708 A | 8/1995 | |
| JP | 09-232235 A | 9/1997 | |
| JP | 2000-174310 A | 6/2000 | |
| JP | 2000-269201 A | 9/2000 | |
| JP | 2000-277439 A | 10/2000 | |
| JP | 2001-053283 A | 2/2001 | |
| JP | 3201492 | 8/2001 | |
| JP | 2002-206168 A | 7/2002 | |
| JP | 2002-246605 A | 8/2002 | |
| JP | 2002-280309 A | 9/2002 | |
| JP | 2003-037278 A | 2/2003 | |
| JP | 2004-200345 A | 7/2004 | |
| JP | 2005-049832 A | 2/2005 | |
| JP | 2005-167264 A | 6/2005 | |
| JP | 2005-191546 A | 7/2005 | |
| JP | 2006-237490 A | 9/2006 | |
| JP | 2009-044134 A | 2/2009 | |
| JP | 2009-076753 A | 4/2009 | |
| JP | 2009-088501 A | 4/2009 | |

OTHER PUBLICATIONS

Lee.C et al., "Directly Deposited Nanocrystalline Silicon Thin-Film Transistors With Ultra High Mobilities," Appl. Phys. Lett. (Applied Physics Letters), Dec. 18, 2006, vol. 89, No. 25, pp. 252101-1-252101-3.

Lee.C et al., "High-Mobility Nanocrystalline Silicon Thin-Film Transistors Fabricated by Plasma-Enhanced Chemical Vapor Deposition," Appl. Phys. Lett. (Applied Physics Letters), May 24, 2005, vol. 86, pp. 222106-1-222106-3.

Lee.C et al., "High-Mobility N-Channel and P-Channel Nanocrystalline Silicon Thin-Film Transistors," IEDM 05: Technical Digest of International Electron Devices Meeting, 2005, pp. 937-940.

Lee.C et al., "How to Achieve High Mobility Thin Film Transistors by Direct Deposition of Silicon Using 13.56 MHz RF PECVD?," IEDM, 2006, pp. 295-298.

Esmaeili-Rad.M et al., "High Stability, Low Leakage Nanocrystalline Silicon Bottom Gate Thin Film Transistors for AMOLED Displays," IEEE IEDM, 2006, pp. 303-306.

Lee.H et al., "Leakage Current Mechanisms in Top-Gate Nanocrystalline Silicon Thin-Film Transistors," Appl. Phys. Lett. (Applied Physics Letters), Feb. 28, 2008, vol. 92, pp. 083509-1-083509-3.

Esmaeili-Rad.M et al., "Absence of Defect State Creation in Nanocrystalline Silicon Thin-Film Transistors Deduced from Constant Current Stress Measurements," Appl. Phys. Lett. (Applied Physics Letters), Sep. 12, 2007, vol. 91, pp. 113511-1-113511-3.

Lee.C et al., "Stability of NC-Si:H TFTs With Silicon Nitride Gate Dielectric," IEEE Transactions on Electron Devices, 2007, vol. 54, No. 1, pp. 45-51.

Sazonov.A et al., "Low-Temperature Materials and Thin Film Transistors for Flexible Electronics," Proceedings of the IEEE, Aug. 1, 2005, vol. 93, No. 8, pp. 1420-1428.

Arai.T et al., "41.2: Micro Silicon Technology for Active Matrix OLED Display," SID Digest '07 : SID International Symposium Digest of Technical Papers, 2007, vol. 38, pp. 1370-1373.

* cited by examiner 101　103　105　107

109

107　111a　111b　115　113　111　109

117b　117a　117　121

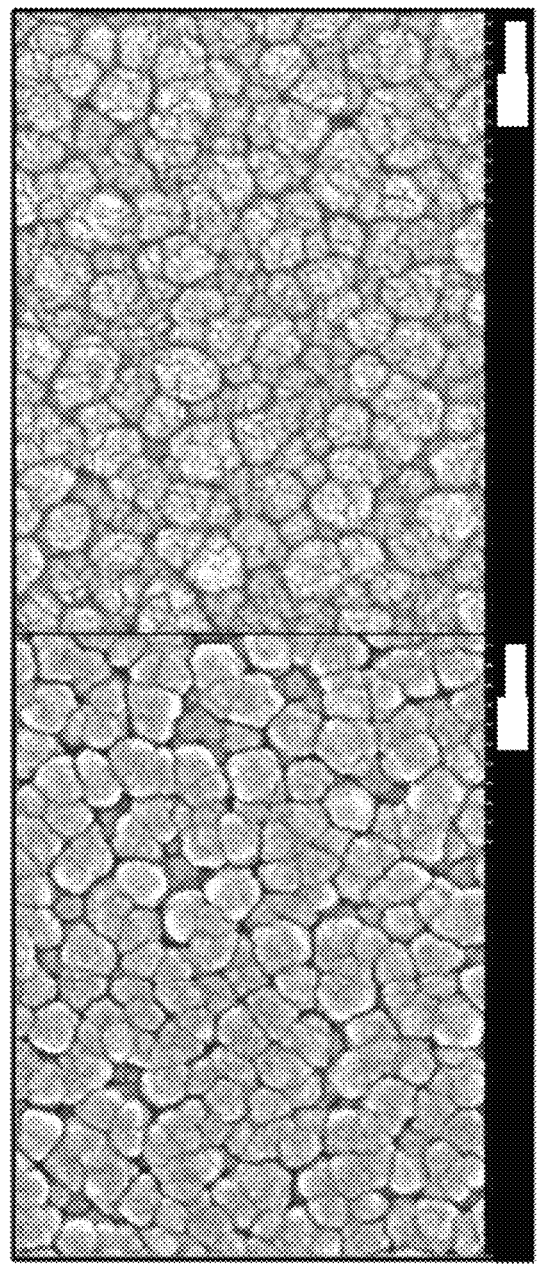

MANUFACTURING METHOD OF MICROCRYSTALLINE SILICON FILM AND MANUFACTURING METHOD OF SEMICONDUCTOR DEVICE

BACKGROUND OF THE INVENTION

1. Field of the Invention

The present invention relates to a manufacturing method of a microcrystalline silicon film and a manufacturing method of a semiconductor device including the microcrystalline silicon film.

2. Description of the Related Art

As one type of field-effect transistor, a thin film transistor whose channel region is formed using a silicon film which is formed over a substrate having an insulating surface is known. Techniques in which amorphous silicon, microcrystalline silicon, or polycrystalline silicon is used for the silicon film which is used for the channel region of the thin film transistor have been disclosed (see Patent Documents 1 to 5). A typical application of the thin film transistor is a liquid crystal television device, in which the thin film transistor is practically used as a switching transistor in each pixel in a display screen.

A thin film transistor whose channel region is formed using an amorphous silicon film has problems of low field-effect mobility and low on-state current. On the other hand, a thin film transistor whose channel region is formed using a microcrystalline silicon film has a problem in that, though the field-effect mobility is improved, the off-state current is higher as compared to that of the thin film transistor whose channel region is formed using an amorphous silicon film and thus sufficient switching characteristics cannot be obtained.

A thin film transistor whose channel region is formed using a polycrystalline silicon film features in that the field-effect mobility is far higher and the on-state current is higher than those of the above-described two kinds of thin film transistors. These features enable this kind of thin film transistor to be used not only as a switching transistor in a pixel but also as an element of a driver circuit that needs to drive at high speed.

However, a manufacturing process of the thin film transistor whose channel region is formed using a polycrystalline silicon film involves a crystallization step for a silicon film and has a problem of higher manufacturing costs, as compared to a manufacturing process of the thin film transistor whose channel region is formed using an amorphous silicon film. For example, a laser annealing technique necessary in the process for forming a polycrystalline silicon film has a problem in that large-screen liquid crystal panels cannot be produced efficiently because the area capable of being irradiated with a laser beam is small.

The size of a glass substrate for manufacturing display panels has grown in the following ascending order: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm, 2450 mm×3050 mm), and the 10th generation (2950 mm×3400 mm). The increase in size of the glass substrate is based on the concept of minimum cost design.

However, a technique with which a thin film transistor capable of high-speed operation can be manufactured with high productivity over a large-sized mother glass substrate such as the 10th generation (2950 mm×3400 mm) mother glass substrate has not been established yet, which is a problem in industry.

REFERENCE

Patent Document

[Patent Document 1] Japanese Published Patent Application No. 2001-053283
[Patent Document 2] Japanese Published Patent Application No. H5-129608
[Patent Document 3] Japanese Published Patent Application No. 2005-049832
[Patent Document 4] Japanese Published Patent Application No. H7-131030
[Patent Document 5] Japanese Published Patent Application No. 2005-191546

SUMMARY OF THE INVENTION

In order to improve characteristics of a microcrystalline silicon film, both high crystallinity and high film density need to be achieved. One reason why the field-effect mobility does not increase with the microcrystalline silicon film is because there is a trade-off between crystallinity and film density and it is difficult to achieve both. An object of one embodiment of the present invention is to provide a manufacturing method of a microcrystalline silicon film having both high crystallinity and high film density. Another object of one embodiment of the present invention is to provide a manufacturing method of a semiconductor device having favorable electric characteristics with high productivity.

One embodiment of the present invention is a manufacturing method of a microcrystalline silicon film, which includes the steps of forming a first microcrystalline silicon film which includes mixed phase grains including a silicon crystallite and amorphous silicon over an insulating film under a first condition by a plasma CVD method, and forming a second microcrystalline silicon film over the first microcrystalline silicon film under a second condition by a plasma CVD method. The first condition is a condition in which a gas containing a deposition gas containing silicon and hydrogen is used as a source gas supplied to a treatment chamber and a pressure inside the treatment chamber is set to be higher than or equal to 67 Pa and lower than or equal to 1333 Pa. The source gas is supplied under the first condition by alternating supply of a first gas obtained by diluting the deposition gas by setting a flow rate of hydrogen to be greater than or equal to 50 times and less than or equal to 1000 times that of the deposition gas, and supply of a second gas in which the flow rate of the deposition gas is less than that of the deposition gas of the first gas and is set so as to primarily cause etching of silicon deposited over the insulating film rather than deposition of silicon over the insulating film. The second condition is a condition in which a gas containing a deposition gas containing silicon and hydrogen is used as a source gas supplied to a treatment chamber, the deposition gas is diluted by setting a flow rate of hydrogen to be greater than or equal to 100 times and less than or equal to 2000 times that of the deposition gas, and a pressure inside the treatment chamber is set to be higher than or equal to 1333 Pa and lower than or equal to 13332 Pa. Note that the power of the plasma is preferably selected as appropriate in accordance with the flow rate ratio of hydrogen to the deposition gas containing silicon. Note that the mixed phase grains each include an amorphous silicon region and a plurality of crystallites that are microcrystals regarded as single crystals. In some cases, the mixed phase grains may include a twin crystal.

In one embodiment of the present invention, a third microcrystalline silicon film may be formed over the second microcrystalline silicon film by a plasma CVD method under a third condition, after the second microcrystalline silicon film is formed under the second condition. The third condition may be a condition in which a gas containing a deposition gas containing silicon and hydrogen is used as a source gas supplied to a treatment chamber, the deposition gas is diluted by setting a flow rate ratio of hydrogen to the deposition gas to be higher than that in the second condition, and a pressure inside the treatment chamber is set to be higher than or equal to 1333 Pa and lower than or equal to 13332 Pa.

Further in one embodiment of the present invention, it is preferable that the first condition enable the mixed phase grains each serving as a nucleus to be formed, uniformity of grain sizes of the mixed phase grains to be high, and a density of the mixed phase grains to be low, and that the second condition enable a density of the microcrystalline silicon film to be high.

Further in one embodiment of the present invention, a rare gas can be contained in at least one of the source gas of the first condition, the source gas of the second condition, and the source gas of the third condition.

One embodiment of the present invention is a manufacturing method of a microcrystalline silicon film, which includes the steps of forming a first microcrystalline silicon film including a plurality of mixed phase grains over an insulating film by a plasma CVD method under a first condition that enables the mixed phase grains each serving as a nucleus to be formed, uniformity of grain sizes of the mixed phase grains to be high, and a density of the mixed phase grains to be low; and forming a second microcrystalline silicon film over the first microcrystalline silicon film by a plasma CVD method under a second condition which enables the second microcrystalline silicon film to fill a space between the mixed phase grains of the first microcrystalline silicon film and a film density to be high. The first condition is a condition in which a gas containing a deposition gas containing silicon and hydrogen is used as a source gas supplied to a treatment chamber. The source gas is supplied under the first condition by alternating supply of a first deposition gas and hydrogen in which flow rates of the first deposition gas and hydrogen are such flow rates as to primarily cause deposition of silicon over the insulating film rather than etching of silicon deposited over the insulating film, and supply of a second deposition gas and hydrogen in which the flow rates of the second deposition gas and hydrogen are such flow rates as to primarily cause etching of silicon deposited over the insulating film rather than deposition of silicon over the insulating film and in which the flow rate of the deposition gas is less than that of the first deposition gas. The mixed phase grains each include a silicon crystallite and amorphous silicon.

In one embodiment of the present invention, it is preferable that the first condition enable a higher crystallinity of the mixed phase grains and a higher crystal growth rate of the mixed phase grains than the second condition.

Further in one embodiment of the present invention, the flow rate of the second deposition gas may be higher than or equal to 0 sccm when the flow rate is set so as to primarily cause the etching.

One embodiment of the present invention is a manufacturing method of a semiconductor device including a thin film transistor including a gate electrode, a source region, a drain region, and a channel region. The manufacturing method includes a step of forming a microcrystalline silicon film used to form the channel region by forming a first microcrystalline silicon film which includes mixed phase grains including a silicon crystallite and amorphous silicon by a plasma CVD method under a first condition and forming a second microcrystalline silicon film over the first microcrystalline silicon film by a plasma CVD method under a second condition. The first condition is a condition in which a gas containing a deposition gas containing silicon and hydrogen is used as a source gas supplied to a treatment chamber, and a pressure inside the treatment chamber is set to be higher than or equal to 67 Pa and lower than or equal to 1333 Pa. The source gas is supplied under the first condition by alternating supply of a first gas obtained by diluting the deposition gas by setting a flow rate of hydrogen to be greater than or equal to 50 times and less than or equal to 1000 times that of the deposition gas, and supply of a second gas in which the flow rate of the deposition gas is less than that of the deposition gas of the first gas and is set so as to primarily cause etching of silicon deposited over the insulating film rather than deposition of silicon over the insulating film. The second condition is a condition in which a gas containing a deposition gas containing silicon and hydrogen is used as a source gas supplied to a treatment chamber, the deposition gas is diluted by setting a flow rate of hydrogen to be greater than or equal to 100 times and less than or equal to 2000 times that of the deposition gas, and a pressure inside the treatment chamber is set to be higher than or equal to 1333 Pa and lower than or equal to 13332 Pa.

In one embodiment of the present invention, the microcrystalline silicon film may be formed by forming a third microcrystalline silicon film over the second microcrystalline silicon film by a plasma CVD method under a third condition after the second microcrystalline silicon film is formed under the second condition. The third condition may be a condition in which a gas containing a deposition gas containing silicon and hydrogen is used as a source gas supplied to a treatment chamber, the deposition gas is diluted by setting a flow rate ratio of hydrogen to the deposition gas to be higher than that in the second condition, and a pressure inside the treatment chamber is set to be higher than or equal to 1333 Pa and lower than or equal to 13332 Pa.

One embodiment of the present invention is a manufacturing method of a semiconductor device including a thin film transistor including a gate electrode, a source region, a drain region, and a channel region. The manufacturing method includes a step of forming a microcrystalline silicon film used to form the channel region by forming a first microcrystalline silicon film including a plurality of mixed phase grains over an insulating film by a plasma CVD method under a first condition that enables the mixed phase grains each serving as a nucleus to be formed, uniformity of grain sizes of the mixed phase grains to be high, and a density of the mixed phase grains to be low, and forming a second microcrystalline silicon film over the first microcrystalline silicon film by a plasma CVD method under a second condition which enables the second microcrystalline silicon film to fill a space between the mixed phase grains of the first microcrystalline silicon film and a film density to be high. The first condition is a condition in which a gas containing a deposition gas containing silicon and hydrogen is used as a source gas supplied to a treatment chamber. The source gas is supplied under the first condition by alternating supply of a first deposition gas and hydrogen in which flow rates of the first deposition gas and hydrogen are such flow rates as to primarily cause deposition of silicon over the insulating film rather than etching of silicon deposited over the insulating film, and supply of a second deposition gas and hydrogen in which the flow rates of the second deposition gas and hydrogen are such flow rates as to primarily cause etching of silicon deposited over the insulating film rather than deposition of silicon over the insulating film and in which the flow rate of the deposition gas is less than that of the first deposition gas. The mixed phase grains each include a silicon crystallite and amorphous silicon.

Further in one embodiment of the present invention, the flow rate of the second deposition gas may be higher than or equal to 0 sccm when the flow rate is set so as to primarily cause the etching.

With one embodiment of the present invention, a microcrystalline silicon film having both high crystallinity and high film density can be formed. Furthermore, with one embodiment of the present invention, a semiconductor device having favorable electric characteristics can be manufactured with high productivity.

BRIEF DESCRIPTION OF THE DRAWINGS

In the accompanying drawings:

FIG. 9A is a SEM photograph of Sample 1 in the state after formation of a second microcrystalline silicon film and FIG. 9B is a SEM photograph of Sample 2 in the state after formation of a second microcrystalline silicon film.

DETAILED DESCRIPTION OF THE INVENTION

Hereinafter, embodiments of the present invention will be described in detail with reference to the drawings. However, the present invention is not limited to the following description and it is easily understood by those skilled in the art that the mode and details can be variously changed without departing from the scope and spirit of the present invention. Therefore, the present invention should not be construed as being limited to the description of the following embodiments.

Embodiment 1

In this embodiment, a manufacturing method of a microcrystalline silicon film having high crystallinity will be described with reference to FIGS. 1A and 1B.

Figure 1A:
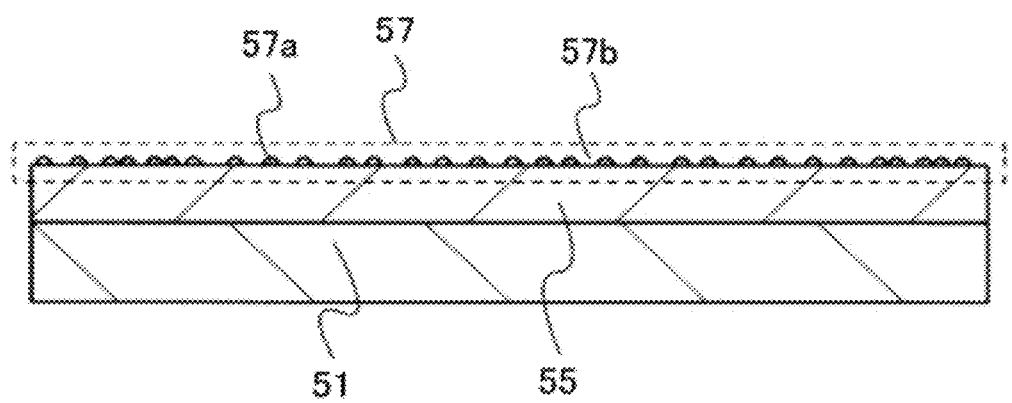
FIGS. 1A and 1B are cross-sectional views illustrating a manufacturing method of a microcrystalline silicon film having high crystallinity according to one embodiment of the present invention.

As illustrated in FIG. 1A, an insulating film 55 is formed over a substrate 51, and a first microcrystalline silicon film 57 which includes mixed phase grains 57a including silicon crystallites and amorphous silicon is formed over the insulating film 55 using a plasma CVD method.

As the substrate 51, a glass substrate, a ceramic substrate, or the like can be used. Note that there is no limitation on the size of the substrate 51. For example, any of glass substrates of the 3rd to 10th generations which are often used in the field of the above flat panel displays can be used.

The insulating film 55 can be formed as a single layer or a stacked layer using a silicon nitride film, a silicon nitride oxide film, a silicon oxide film, or a silicon oxynitride film using a CVD method, a sputtering method, or the like.

Although the insulating film 55 is formed in this embodiment, it is not always necessary to form the insulating film 55.

The first microcrystalline silicon film 57 has low density of mixed phase grains 57a (existing percentage of mixed phase grains in a plane), high uniformity of grain sizes of the mixed phase grains, and high crystallinity of the mixed phase grains 57a. Therefore, the first microcrystalline silicon film 57 may have a space 57b between the adjacent mixed phase grains 57a without the adjacent mixed phase grains 57a being in contact with each other. The thickness of the first microcrystalline silicon film 57 is preferably greater than or equal to 1 nm and less than or equal to 10 nm. In a region having the space 57b between the adjacent mixed phase grains 57a without the adjacent mixed phase grains 57a being in contact with each other, the smallest height of the mixed phase grains 57a which are not in contact with each other is preferably 1 nm or more and the largest height of the mixed phase grains 57a which are not in contact with each other is preferably 10 nm or less. Note that the mixed phase grains 57a each include an amorphous silicon region and a plurality of crystallites that are microcrystals regarded as single crystals. In some cases, the mixed phase grains 57a may include a twin crystal.

The first microcrystalline silicon film 57 is formed in a treatment chamber of a plasma CVD apparatus, using plasma generated by glow discharge with the use of a mixture of a deposition gas containing silicon and hydrogen as a source gas, under a first condition which enables mixed phase grains serving as nuclei to be formed in the state that the density of the mixed phase grains is low and the crystallinity of the mixed phase grains is high. Alternatively, the first microcrystalline silicon film 57 is formed using plasma generated by glow discharge with the use of a mixture of a deposition gas containing silicon, hydrogen, and a rare gas such as helium, neon, or krypton. Here, the microcrystalline silicon is formed under the first condition in which the pressure inside the treatment chamber is higher than or equal to 67 Pa and lower than or equal to 1333 Pa (higher than or equal to 0.5 Torr and lower than or equal to 10 Torr). The supplying method of the source gas under the first condition is as follows: supply of a gas obtained by diluting the deposition gas containing silicon by setting the flow rate of hydrogen to be greater than or equal to 50 times and less than or equal to 1000 times that of the deposition gas and supply of a gas in which the flow rate of the deposition gas is less than that of the deposition gas in the gas supplied as above and is set so as to primarily cause etching of silicon deposited over the insulating film 55 rather than deposition of silicon over the insulating film 55 are alternately performed. Note that the flow rate of the deposition gas which primarily causes the etching may be 0 sccm. The deposition temperature at this time is preferably from room temperature to 300° C., and further preferably 150° C. to 280° C. The distance between an upper electrode and a lower electrode of the plasma CVD apparatus may be set to a distance which enables generation of plasma.

The supplying method of the source gas under the first condition is a method in which the flow rate of the deposition gas containing silicon is changed to alternate between high and low flow rates during generation of plasma by glow discharge. During the period in which the deposition gas is supplied at a low flow rate, etching of silicon deposited over the insulating film 55 primarily occurs rather than deposition of silicon over the insulating film 55. In contrast, during the period in which the deposition gas is supplied at a high flow rate, deposition of silicon over the insulating film 55 primarily occurs rather than etching of silicon deposited over the insulating film 55. Thus, an amorphous silicon component is selectively etched by the hydrogen gas during the period in which the deposition gas is supplied at a low flow rate, and the mixed phase grains 57a grow during the period in which the deposition gas is supplied at a high flow rate. By the repetition of the etching and the growth, the first microcrystalline silicon film 57 including a small amount of amorphous silicon component and having high crystallinity can be obtained.

The supply of the deposition gas at a high flow rate enlarges the mixed phase grains 57a that have already been deposited over the insulating film 55 and produces new mixed phase grains 57a over the insulating film 55. The supply of the deposition gas at a low flow rate causes etching and removal of the small mixed phase grains 57a that have just been generated but leaves the relatively large mixed phase grains 57a that have already been deposited over the insulating film 55. By the repetition of the growth and the etching, the mixed phase grains with small grain sizes are reduced. Accordingly, the first microcrystalline silicon film 57 including many mixed phase grains 57a having large and highly uniform grain sizes can be obtained.

With the first condition in this manner, crystal growth is promoted and the crystallinity of the mixed phase grains 57a is increased. That is, the size of the crystallites included in the mixed phase grains 57a is increased. Further, the space 57b is formed between the adjacent mixed phase grains 57a, so that the density of mixed phase grains 57a is lowered.

The use of the above-described supplying method of the source gas in which the flow rate of the deposition gas is changed to alternate between high and low flow rates makes the grain size of the mixed phase grains 57a deposited over the insulating film 55 large, the uniformity of the mixed phase grains high, and the crystallinity of the mixed phase grains high as compared to the case of supplying the deposition gas at a constant flow rate without the flow rate thereof changed.

As typical examples of the deposition gas containing silicon, there are $SiH_4$ and $Si_2H_6$.

In the case where a rare gas such as helium, argon, neon, krypton, or xenon is mixed into the source gas of the first microcrystalline silicon film 57, the deposition rate of the first microcrystalline silicon film 57 is increased. Moreover, in the case where the deposition rate is increased, the amount of impurities mixed in the first microcrystalline silicon film 57 is reduced, so that the crystallinity of the first microcrystalline silicon film 57 can be improved.

In the glow discharge at the time of forming the first microcrystalline silicon film 57, the plasma is generated by application of high-frequency power with a frequency of 3 MHz to 30 MHz, typically, 13.56 MHz or 27.12 MHz in the HF band, or high-frequency power with a frequency of approximately 30 MHz to 300 MHz in the VHF band, typically 60 MHz. It is preferable to determine the power for generating the plasma as appropriate in accordance with the flow rate ratio of hydrogen to the deposition gas containing silicon.

Figure 1B:
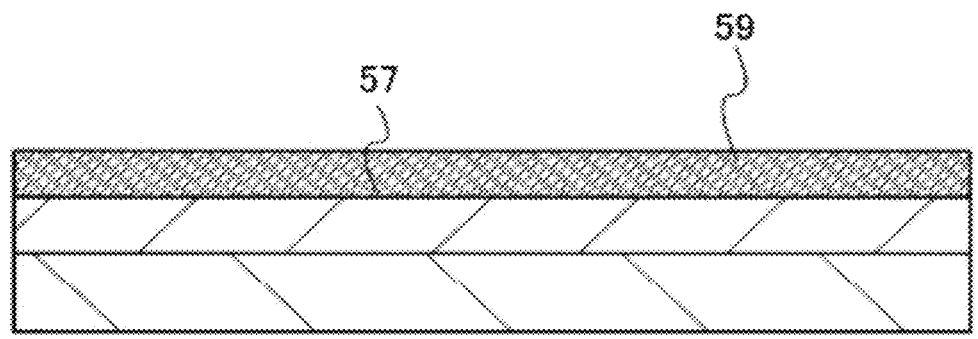

Next, as illustrated in FIG. 1B, a second microcrystalline silicon film 59 which includes mixed phase grains including silicon crystallites and amorphous silicon is formed over the first microcrystalline silicon film 57. The second microcrystalline silicon film 59 is formed under a condition which enables the second microcrystalline silicon film 59 to fill the space 57b between the mixed phase grains 57a of the first microcrystalline silicon film 57 and also promotes crystal growth. Note that the thickness of the second microcrystalline silicon film 59 is preferably greater than or equal to 30 nm and less than or equal to 100 nm.

The second microcrystalline silicon film 59 is formed in a treatment chamber of the plasma CVD apparatus, using plasma generated by glow discharge with the use of a mixture of a deposition gas containing silicon and hydrogen as a source gas under a second condition. Alternatively, the second microcrystalline silicon film 59 may be formed using plasma generated by glow discharge with the use of a mixture of a deposition gas containing silicon, hydrogen, and a rare gas such as helium, neon, or krypton under the second condition. Here, the microcrystalline silicon is formed under the second condition in which the deposition gas containing silicon is diluted by setting the flow rate of hydrogen to be greater than or equal to 100 times and less than or equal to 2000 times that of the deposition gas and the pressure inside the treatment chamber is set to be higher than or equal to 1333 Pa and lower than or equal to 13332 Pa (higher than or equal to 10 Torr and lower than or equal to 100 Torr). As a result, the ratio of a crystalline region to the amorphous silicon region is increased in the second microcrystalline silicon film 59, whereby the crystallinity is increased. The deposition temperature at this time is preferably from room temperature to 300° C., and further preferably 150° C. to 280° C. The distance between an upper electrode and a lower electrode of the plasma CVD apparatus is set to a distance which enables generation of plasma. By newly generating the mixed phase grains of the second microcrystalline silicon film in spaces between the mixed phase grains of the first microcrystalline silicon film, the size of the mixed phase grains is reduced. Therefore, it is preferable that the frequency of generation of the mixed phase grains of the second microcrystalline silicon film is lower than that of the mixed phase grains of the first microcrystalline silicon film.

In the case where a rare gas such as helium, argon, neon, krypton, or xenon is mixed into the source gas of the second microcrystalline silicon film 59, the crystallinity of the second microcrystalline silicon film 59 can be improved in a manner similar to that of the first microcrystalline silicon film 57.

The condition for generating plasma by glow discharge at the time of forming the first microcrystalline silicon film 57 can be employed as appropriate for the second microcrystalline silicon film 59. In the case where the condition for generating plasma by glow discharge at the time of forming the first microcrystalline silicon film 57 and that at the time of forming the second microcrystalline silicon film 59 are the same, throughput can be increased; however, they may be different from each other.

The first microcrystalline silicon film 57 and the second microcrystalline silicon film 59 are formed of microcrystalline silicon. Note that microcrystalline silicon is a semiconductor having an intermediate structure between an amorphous structure and a crystalline structure (including single crystal and polycrystal). Microcrystalline silicon is a semiconductor having a third state that is stable in terms of free energy and is a crystalline semiconductor having short-range order and lattice distortion, in which columnar or needle-like mixed phase grains having a grain size of 2 nm to 200 nm, preferably 10 nm to 80 nm, further preferably 20 nm to 50 nm, still further preferably 25 nm to 33 nm have grown in a direction normal to the substrate surface. Therefore, there is a case in which a crystal grain boundary is formed at the interface between the columnar or needle-like mixed phase grains.

The Raman spectrum of microcrystalline silicon is shifted to a smaller wavenumber region than 520 cm$^{-1}$ which represents single crystal silicon. That is, the peak of the Raman spectrum of the microcrystalline silicon exists between 520 cm$^{-1}$ which represents single crystal silicon and 480 cm$^{-1}$ which represents amorphous silicon. Microcrystalline silicon includes at least 1 at. % or more of hydrogen or halogen to terminate a dangling bond. Moreover, the microcrystalline silicon may contain a rare gas element such as helium, argon, krypton, or neon to further promote lattice distortion, so that stability is increased and favorable microcrystalline silicon can be obtained. Such microcrystalline silicon is disclosed in, for example, U.S. Pat. No. 4,409,134.

In this embodiment, by reducing spaces between mixed phase grains, a microcrystalline silicon film having high crystallinity can be formed.

As described above, at the time of forming the first microcrystalline silicon film 57, the use of the supplying method of the source gas in which the flow rate of the deposition gas is changed to alternate between high and low flow rates makes the grain size of the mixed phase grains 57a deposited over the insulating film 55 large and the crystallinity of the mixed phase grains 57a high as compared to the case of supplying the deposition gas at a constant flow rate without the flow rate thereof changed. Further, by employing the two-step film formation method in which the second microcrystalline silicon film 59 is stacked over the first microcrystalline silicon film 57, the spaces between the mixed phase grains are effectively filled to keep high film density; thus, a microcrystalline silicon film having large grain size and high crystallinity can be formed. As a result, the field-effect mobility can be increased, and a device with excellent electrical characteristics can be realized.

Embodiment 2

In this embodiment, a manufacturing method of a microcrystalline silicon film having higher crystallinity than the microcrystalline silicon film of Embodiment 1 will be described with reference to FIGS. 1A and 1B and FIG. 2.

In a manner similar to that of Embodiment 1, a first microcrystalline silicon film 57 and a second microcrystalline silicon film 59 are formed through the process of FIGS. 1A and 1B.

Figure 2:
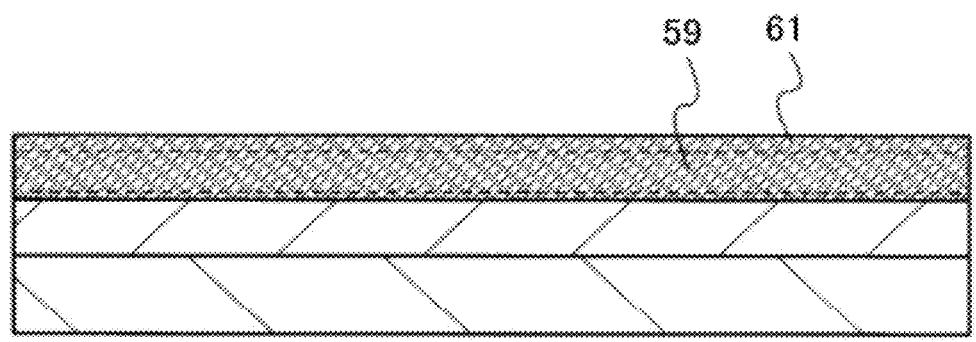
FIG. 2 is a cross-sectional view illustrating a manufacturing method of a microcrystalline silicon film having high crystallinity according to one embodiment of the present invention.

Next, as illustrated in FIG. 2, a third microcrystalline silicon film 61 which includes mixed phase grains including silicon crystallites and amorphous silicon is formed over the second microcrystalline silicon film 59.

The third microcrystalline silicon film 61 is formed in a treatment chamber of the plasma CVD apparatus, using plasma generated by glow discharge with the use of a mixture of a deposition gas containing silicon and hydrogen as a source gas under a third condition. Alternatively, the third microcrystalline silicon film 61 may be formed using plasma generated by glow discharge with the use of a mixture of a deposition gas containing silicon, hydrogen, and a rare gas such as helium, neon, or krypton as a source gas under the third condition. Here, the third microcrystalline silicon film is formed under the third condition in which the deposition gas containing silicon is diluted by setting the flow rate ratio of hydrogen to the deposition gas to be higher than that in the second condition and the pressure inside the treatment chamber is set higher than or equal to 1333 Pa and lower than or equal to 13332 Pa (higher than or equal to 10 Torr and lower than or equal to 100 Torr) in a manner similar to that of the second condition. The deposition temperature at this time is preferably from room temperature to 300° C., and further preferably 150° C. to 280° C.

The supplying method of the source gas under the third condition may be similar to the supplying method of the source gas under the first condition in Embodiment 1 as follows: supply of a gas obtained by diluting a deposition gas by setting the flow rate ratio of hydrogen to the deposition gas containing silicon to be higher than under the second condition and supply of a gas in which the flow rate of the deposition gas is less than that of the deposition gas in the gas supplied as above and is set so as to primarily cause etching of silicon deposited over the second microcrystalline silicon film 59 rather than deposition of silicon over the second microcrystalline silicon film 59 are alternately performed.

By setting the flow rate ratio of hydrogen to the deposition gas containing silicon to be higher than that in the second condition, the crystallinity of the third microcrystalline silicon film 61 can be further increased, and a microcrystalline silicon film whose surface crystallinity is higher than that of the microcrystalline silicon film in Embodiment 1 can be formed.

Embodiment 3

In this embodiment, a manufacturing method of a thin film transistor formed in a semiconductor device that is an embodiment of the present invention will be described with reference to FIGS. 3A to 3D, FIGS. 4A and 4B, and FIGS. 5A to 5C. Note that an n-channel thin film transistor has higher carrier mobility than a p-channel thin film transistor. In this embodiment, a manufacturing method of an n-channel thin film transistor will be described.

Figure 3A:
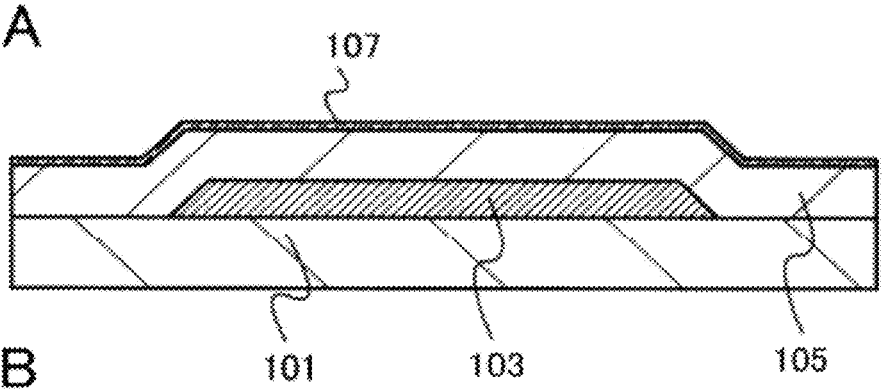
FIGS. 3A to 3D are cross-sectional views illustrating a manufacturing method of a semiconductor device according to one embodiment of the present invention.

As illustrated in FIG. 3A, a gate electrode 103 is formed over a substrate 101. Then, a gate insulating film 105 which covers the gate electrode 103 (also referred to as a first gate electrode) is formed. A first microcrystalline silicon film 107 is formed over the gate insulating film 105.

As the substrate 101, the substrate 51 described in Embodiment 1 can be used as appropriate.

The gate electrode 103 can be formed in the following manner: a conductive film is formed over the substrate 101 by a sputtering method or a vacuum evaporation method using any metal material of Mo, Ti, Cr, Ta, W, Al, Cu, Nd, Sc, or Ni; a mask is formed over the conductive film by a photolithography method; and the conductive film is etched using the mask. In order to improve adhesion between the gate electrode 103 and the substrate 101, a nitride film of any of the above-described metal materials may be provided between the substrate 101 and the gate electrode 103. In this embodiment, a conductive film is formed over the substrate 101 and etched using a resist mask formed by a photolithography method.

Note that side surfaces of the gate electrode 103 are preferably tapered. This is because an insulating film, a silicon film, and a wiring formed over the gate electrode 103 in later steps can be prevented from being cut at a step portion of the gate electrode 103. In order to taper the side surfaces of the gate electrode 103, etching may be performed while the resist mask is made to recede.

The gate insulating film 105 can be formed using the insulating film 55 described in Embodiment 1 as appropriate.

The gate insulating film 105 can be formed by a CVD method, a sputtering method, or the like.

Note that in the case where the gate insulating film 105 is formed using a silicon nitride film or a silicon nitride oxide film, the threshold voltage of the thin film transistor shifts in the negative direction; therefore, oxygen plasma treatment in which a surface of the gate insulating film 105 is exposed to plasma of an oxidizing gas atmosphere may be performed. The oxidizing gas atmosphere is an atmosphere containing at least one of oxygen, ozone, dinitrogen monoxide, or the like. By the oxygen plasma treatment, a normally-off thin film transistor can be manufactured.

Note that in this specification, an n-channel thin film transistor whose threshold voltage is positive is defined as a normally-off thin film transistor, while a p-channel thin film transistor whose threshold voltage is negative is defined as a normally-off thin film transistor. Further, an n-channel thin film transistor whose threshold voltage is negative is defined as a normally-on thin film transistor, while a p-channel thin film transistor whose threshold voltage is positive is defined as a normally-on thin film transistor.

The first microcrystalline silicon film 107 can be formed under a first condition which enables the density of mixed phase grains to be low, the uniformity of grain sizes of the mixed phase grains to be high, and the crystallinity of the mixed phase grains to be high, in a manner similar to that of the first microcrystalline silicon film 57 described in Embodiment 1.

In the case where a rare gas such as helium, argon, neon, krypton, or xenon is mixed into the source gas of the first microcrystalline silicon film 107, the crystallinity of the first microcrystalline silicon film 107 can be increased. Accordingly, the on-state current and the field-effect mobility of the thin film transistor are increased and the throughput of the thin film transistor can also be increased.

Figure 3B:
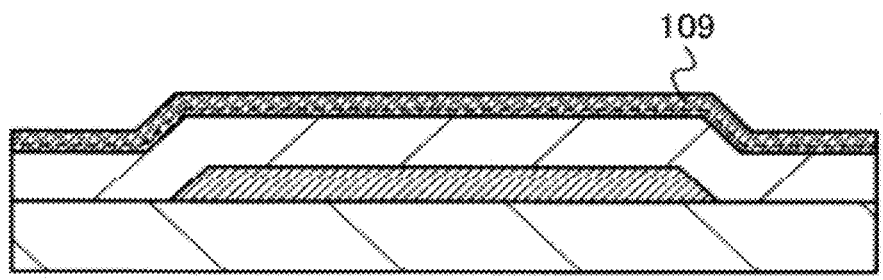

Next, as illustrated in FIG. 3B, a second microcrystalline silicon film 109 is formed over the first microcrystalline silicon film 107. The second microcrystalline silicon film 109 can be formed under a second condition which enables the second microcrystalline silicon film 109 to fill the space between the mixed phase grains of the first microcrystalline silicon film 107 and also promotes crystal growth, in a manner similar to that of the second microcrystalline silicon film 59 described in Embodiment 1.

In the case where a rare gas such as helium, argon, neon, krypton, or xenon is mixed into the source gas of the second microcrystalline silicon film 109, the crystallinity of the second microcrystalline silicon film 109 can be increased in a manner similar to that of the first microcrystalline silicon film 107. Accordingly, the on-state current and the field-effect mobility of the thin film transistor are increased and the throughput of the thin film transistor can also be increased.

Figure 3C:
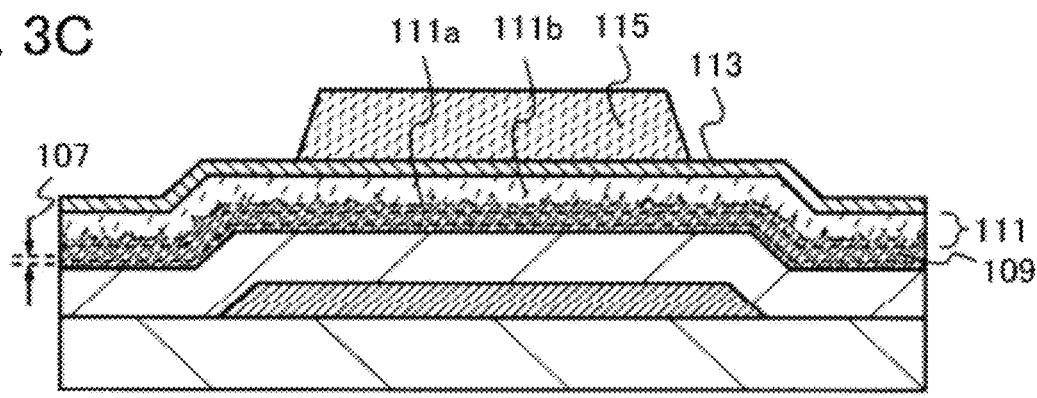

Next, as illustrated in FIG. 3C, a silicon film 111 is formed over the second microcrystalline silicon film 109. The silicon film 111 includes a microcrystalline silicon region 111a and an amorphous silicon region 111b. Then, an impurity silicon film 113 is formed over the silicon film 111, and a resist mask 115 is formed over the impurity silicon film 113.

The silicon film 111 including the microcrystalline silicon region 111a and the amorphous silicon region 111b can be formed under a condition which causes partial crystal growth using the second microcrystalline silicon film 109 as a seed crystal (a condition by which the crystal growth is suppressed).

The silicon film 111 is formed in a treatment chamber of the plasma CVD apparatus, using plasma generated by glow discharge with the use of a mixture of a deposition gas containing silicon, hydrogen, and a gas containing nitrogen. As examples of the gas containing nitrogen, there are ammonia, nitrogen, nitrogen fluoride, and nitrogen chloride. Generation of plasma by glow discharge can be performed in a manner similar to that of the first microcrystalline silicon film 107.

In that case, the flow rate ratio of hydrogen to the deposition gas containing silicon is set to a ratio for forming a microcrystalline silicon film in a manner similar to that in forming the first microcrystalline silicon film 107 or the second microcrystalline silicon film 109, and the gas containing nitrogen is used as a source gas, whereby crystal growth can be suppressed as compared to the deposition conditions for the first microcrystalline silicon film 107 and the second microcrystalline silicon film 109. Specifically, at an early stage of deposition of the silicon film 111, the gas containing nitrogen included in the source gas partly suppresses the crystal growth, so that a conical microcrystalline silicon region or a pyramidal microcrystalline silicon region grows and an amorphous silicon region is formed. Further, at a middle stage or a later stage of the deposition, crystal growth of the conical or pyramidal microcrystalline silicon region stops, and only an amorphous silicon region is deposited. Accordingly, in the silicon film 111, the microcrystalline silicon region 111a and the amorphous semiconductor region 111b which is formed using a well-ordered silicon film having fewer defects and a steep tail of a level at a valence band edge, can be formed.

Here, a typical example of a condition for forming the silicon film 111 is as follows: the flow rate of hydrogen is 10 times to 2000 times, preferably 10 times to 200 times that of the deposition gas containing silicon. Note that in a typical example of a condition for forming a normal amorphous silicon film, the flow rate of hydrogen is 0 times to 5 times that of the deposition gas containing silicon.

In the case where a rare gas such as helium, neon, argon, xenon, or krypton is introduced into the source gas of the silicon film 111, the deposition rate can be increased.

It is preferable for the silicon film 111 to have a thickness of 50 nm to 350 nm, and further preferable for the silicon film 111 to have a thickness of 120 nm to 250 nm.

Figure 4A:
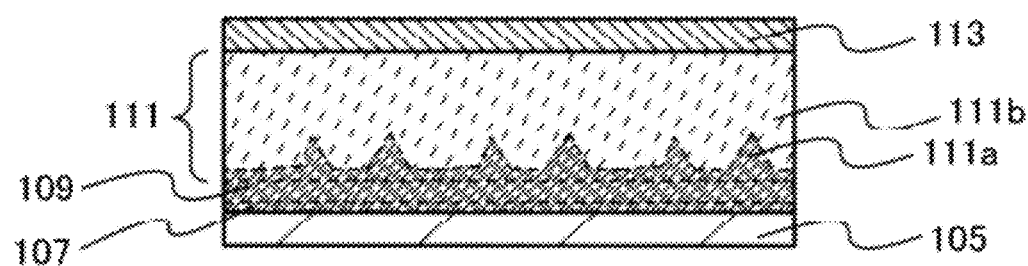
FIGS. 4A and 4B are cross-sectional views illustrating a manufacturing method of a semiconductor device according to one embodiment of the present invention.
Figure 4B:
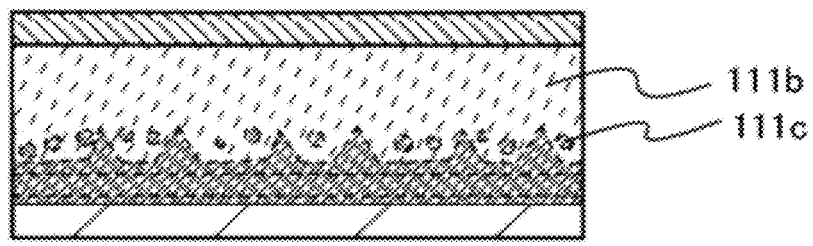

FIGS. 4A and 4B are enlarged views of the portion between the gate insulating film 105 and the impurity silicon film 113 illustrated in FIG. 3C.

As illustrated in FIG. 4A, the microcrystalline silicon region 111a in the silicon film 111 has a projection and a depression; and the projection has a conical or pyramidal shape whose width decreases from the second microcrystalline silicon film 109 side toward the amorphous silicon region 111b side (a tip of the projection has an acute angle). Alternatively, the microcrystalline silicon region 111a may have a projecting (inverted conical or pyramidal) shape whose width increases from the second microcrystalline silicon film 109 side toward the amorphous semiconductor region 111b side.

By setting the thickness of the first microcrystalline silicon film 107, the second microcrystalline silicon film 109, and the microcrystalline silicon region 111a, that is, the distance from the interface between the first microcrystalline silicon film 107 and the gate insulating film 105 to the tip of the projection of the microcrystalline silicon region 111a to 5 nm or more and 310 nm or less, the off-state current of the thin film transistor can be reduced.

Further, in order to improve the crystallinity of the microcrystalline silicon region 111a, it is preferable that the concentration of oxygen contained in the silicon film 111 be less than $1\times10^{18}$ atoms/cm$^3$ by secondary ion mass spectrometry.

The amorphous silicon region 111b is formed of an amorphous semiconductor containing nitrogen. The nitrogen of the amorphous semiconductor containing nitrogen may exist, for example, as an NH group or an NH$_2$ group. As the amorphous semiconductor, amorphous silicon can be used.

Amorphous silicon containing nitrogen is a semiconductor having lower energy at an Urbach edge that is measured by a constant photocurrent method (CPM) or photoluminescence spectroscopy and a smaller amount of defect absorption spectrum, as compared to a conventional amorphous semiconductor. In other words, as compared to the conventional amorphous semiconductor, the amorphous silicon containing nitrogen is a well-ordered semiconductor which has few defects and whose tail of a level at a valence band edge is steep. Since the amorphous silicon containing nitrogen has a steep tail of a level at a valence band edge, the band gap is wide and tunnel current does not flow easily. Therefore, when the amorphous silicon containing nitrogen is provided between the microcrystalline silicon region 111a and the impurity silicon film 113, the off-state current of the thin film transistor can be reduced. In addition, by provision of the amorphous silicon containing nitrogen, the on-state current and the field-effect mobility can be increased.

Further, the peak region of a spectrum of the amorphous silicon containing nitrogen that is measured by low-temperature photoluminescence spectroscopy is higher than or equal to 1.31 eV and lower than or equal to 1.39 eV. Note that the peak region of a spectrum of microcrystalline silicon, which is measured by low-temperature photoluminescence spectroscopy is higher than or equal to 0.98 eV and lower than or equal to 1.02 eV. Accordingly, the amorphous silicon containing nitrogen is different from microcrystalline silicon.

The microcrystalline silicon region 111a, as well as the amorphous silicon region 111b, may include a NH group or an NH$_2$ group.

Further, as illustrated in FIG. 4B, a silicon crystal grain 111c whose grain size is greater than or equal to 1 nm and less than or equal to 10 nm, preferably greater than or equal to 1 nm and less than or equal to 5 nm may be included in the amorphous silicon region 111b, so that the on-state current and the filed-effect mobility can be further increased.

The microcrystalline silicon having a projecting (conical or pyramidal) shape whose width decreases from the second microcrystalline silicon film 109 toward the amorphous silicon region 111b is formed in the following manner: after the second microcrystalline silicon film is formed under the deposition condition for microcrystalline silicon, crystal growth is caused on such a condition that the crystal growth is suppressed, and amorphous silicon is deposited.

Since the microcrystalline silicon region 111a in the silicon film 111 has the conical or pyramidal shape or the inverted conical or pyramidal shape, resistance in a vertical direction (film thickness direction) of when voltage is applied between a source and drain electrodes in an on state, i.e., the resistance of the silicon film 111 can be lowered. Further, tunnel current does not easily flow because amorphous silicon containing nitrogen is provided between the microcrystalline silicon region 111a and the impurity silicon film 113. Amorphous silicon containing nitrogen is a well-ordered semiconductor having few defects and a steep tail of a level at a valence band edge. Thus, in the thin film transistor described in this embodiment, the on-state current and the field-effect mobility can be increased and the off-state current can be reduced.

The impurity silicon film 113 is formed using amorphous silicon to which phosphorus is added, microcrystalline silicon to which phosphorus is added, or the like. A structure in which amorphous silicon to which phosphorus is added and microcrystalline silicon to which phosphorus is added are stacked can also be employed. In the case of forming a p-channel thin film transistor as a thin film transistor, the impurity silicon film 113 is formed using microcrystalline silicon to which boron is added, amorphous silicon to which boron is added, or the like.

The impurity silicon film 113 is formed in a treatment chamber of the plasma CVD apparatus, using plasma generated by glow discharge with the use of a mixture of a deposition gas containing silicon, hydrogen, and phosphine (diluted with hydrogen or silane) as a source gas. The deposition gas containing silicon is diluted with hydrogen, in formation of amorphous silicon to which phosphorus is added or microcrystalline silicon to which phosphorus is added. In the case of manufacturing a p-type thin film transistor, the impurity silicon film 113 may be formed using plasma generated by glow discharge using diborane instead of phosphine.

The resist mask 115 can be formed by a photolithography step.

Figure 3D:
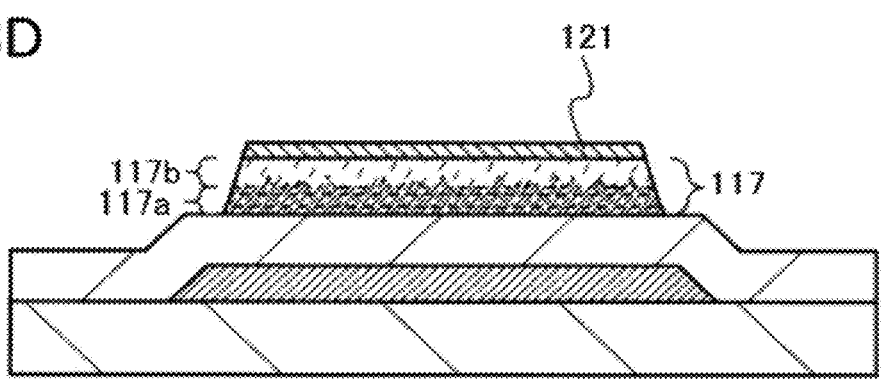

Next, as illustrated in FIG. 3D, the first microcrystalline silicon film 107, the second microcrystalline silicon film 109, the silicon film 111, and the impurity silicon film 113 are etched using the resist mask 115. By this step, the first microcrystalline silicon film 107, the second microcrystalline silicon film 109, the silicon film 111, and the impurity silicon film 113 are divided into elements, so that a silicon stacked body 117 and an impurity silicon film 121 are formed. The silicon stacked body 117 is formed including part of the first microcrystalline silicon film 107, part of the second microcrystalline silicon film 109, and part of the silicon film 111. The silicon stacked body 117 is constituted of a microcrystalline silicon region 117a which includes part of the first microcrystalline silicon film 107, part of the second microcrystalline silicon film 109, and part of the microcrystalline silicon region of the silicon film 111 and an amorphous silicon region 117b which includes part of the amorphous silicon region of the silicon film 111. Then, the resist mask 115 is removed.

Figure 5A:
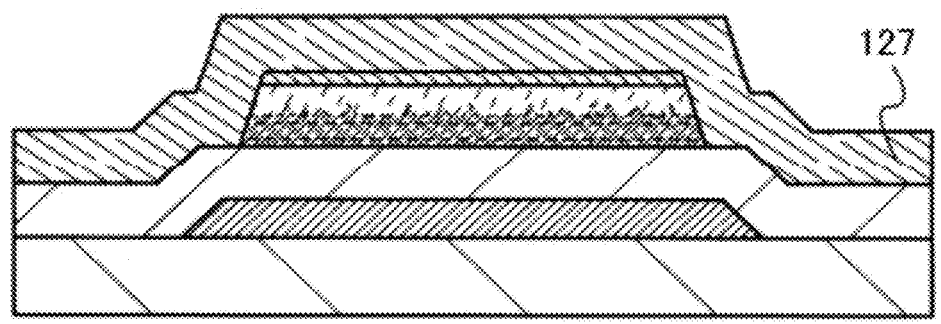
FIGS. 5A to 5C are cross-sectional views illustrating a manufacturing method of a semiconductor device according to one embodiment of the present invention.

Then, as illustrated in FIG. 5A, a conductive film 127 is formed over the impurity silicon film 121. The conductive film 127 is formed by a CVD method, a sputtering method, or a vacuum evaporation method.

Figure 5B:
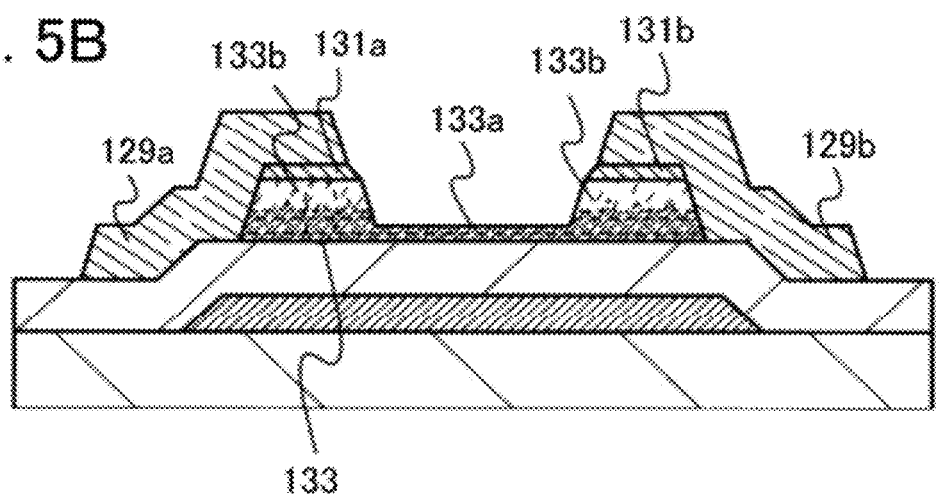

Next, as illustrated in FIG. 5B, wirings 129a and 129b functioning as a source electrode and a drain electrode are formed by forming a resist mask (not illustrated) by a photolithography step and etching the conductive film 127 with the use of the resist mask. The etching of the conductive film 127 may be either dry etching or wet etching. Note that one of the wirings 129a and 129b functions as a signal line as well as a source electrode or a drain electrode. However, without limitation thereto, a signal line may be provided separately from the source and drain electrodes.

Next, the impurity silicon film 121 and the silicon stacked body 117 are partly etched, so that a pair of impurity silicon films 131a and 131b functioning as a source and drain regions are formed. A silicon stacked body 133 including a microcrystalline silicon region 133a and a pair of amorphous silicon regions 133b is formed. At this time, the silicon stacked body 117 is etched so as to expose the microcrystalline silicon region 133a, so that the silicon stacked body 133 is formed in which the microcrystalline silicon region 133a and the amorphous silicon regions 133b are stacked in regions covered with the wirings 129a and 129b and the microcrystalline silicon region 133a is exposed in a region covered with neither the wiring 129a nor the wiring 129b and overlapping with the gate electrode.

Next, dry etching may be performed on the silicon stacked body 133. As the condition for the dry etching, a condition by which the exposed microcrystalline silicon region 133a and the exposed amorphous silicon regions 133b are not damaged and in which the etching rate of the microcrystalline silicon region 133a and the amorphous silicon regions 133b is low is used. That is, a condition by which surfaces of the exposed microcrystalline silicon region 133a and the exposed amorphous silicon regions 133b are hardly damaged and by which the thicknesses of the exposed microcrystalline silicon region 133a and the exposed amorphous silicon regions 133b are hardly reduced is used. As an etching gas, $Cl_2$, $CF_4$, $N_2$, or the like is typically used.

Then, plasma treatment may be performed on the surfaces of the microcrystalline silicon region 133a and the amorphous silicon regions 133b. By the plasma treatment, impurities such as a residue existing on the exposed microcrystalline silicon region 133a and the exposed amorphous silicon regions 133b can be removed and defects of the microcrystalline silicon region 133a can be reduced. Further by the plasma treatment, insulation between the source region and the drain region can be ensured, and thus, in a completed thin film transistor, off-state current can be reduced, and variation in electric characteristics can be reduced.

Through the above-described process, a single-gate thin film transistor can be manufactured. A single-gate thin film transistor with low off-state current, high on-state current, and high field-effect mobility can be manufactured with high productivity. Note that in this embodiment, a thin film transistor whose gate electrode is located below a channel region has been described as a semiconductor device according to an embodiment of the present invention; however, the present invention may also be applied to a dual-gate thin film transistor whose back gate electrode is located above a channel region as a semiconductor device according to an embodiment of the present invention.

Next, an insulating film 137 is formed over the silicon stacked body 133 and the wirings 129a and 129b. The insulating film 137 can be formed in a manner similar to that for the gate insulating film 105.

Next, an opening (not illustrated) is formed in the insulating film 137 with the use of a resist mask formed by a photolithography step. A back gate electrode 139 is formed over the insulating film 137 (see FIG. 5C). Through the above-described process, a dual-gate thin film transistor can be manufactured.

The back gate electrode 139 can be formed in a manner similar to that of the wirings 129a and 129b. Alternatively, the back gate electrode 139 can be formed using a light-transmitting conductive material.

The back gate electrode 139 can be formed in parallel to the gate electrode 103. In this case, the potential applied to the back gate electrode 139 and the potential applied to the gate electrode 103 can each be controlled independently. Thus, the threshold voltage of the thin film transistor can be controlled. Further, regions in which carriers flow, that is, channel regions, are formed on the gate insulating film 105 side and on the insulating film 137 side in the microcrystalline silicon region; thus, the on-state current of the thin film transistor can be increased.

The back gate electrode 139 can be connected to the gate electrode 103. That is, the gate electrode 103 and the back gate electrode 139 can be connected through an opening (not illustrated) formed in the gate insulating film 105 and the insulating film 137. In this case, the potential applied to the back gate electrode 139 and the potential applied to the gate electrode 103 are equal. As a result, in the silicon film, regions in which carriers flow, that is, channel regions are formed on the gate insulating film 105 side and on the insulating film 137 side in the microcrystalline silicon region; thus, the on-state current of the thin film transistor can be increased.

Further alternatively, the back gate electrode 139 is not necessarily connected to the gate electrode 103 and may be in a floating state. In that case, channel regions are formed on the gate insulating film 105 side and on the insulating film 137 side in the microcrystalline silicon region without a potential applied to the back gate electrode 139; thus, the on-state current of the thin film transistor can be increased.

Further, the back gate electrode 139 may overlap with the wirings 129a and 129b with the insulating film 137 provided therebetween.

Through the above-described process, a single-gate thin film transistor and a dual-gate thin film transistor having high on-state current, high field-effect mobility, low off-state current, and small variation in electrical characteristics can be manufactured. In the case where, after exposing a gate insulating film to oxygen plasma, a microcrystalline silicon film as in Embodiment 1 is formed for a channel region, a thin film transistor which is normally off as well as having the above-described effects can be manufactured.

Embodiment 4

Figure 6:
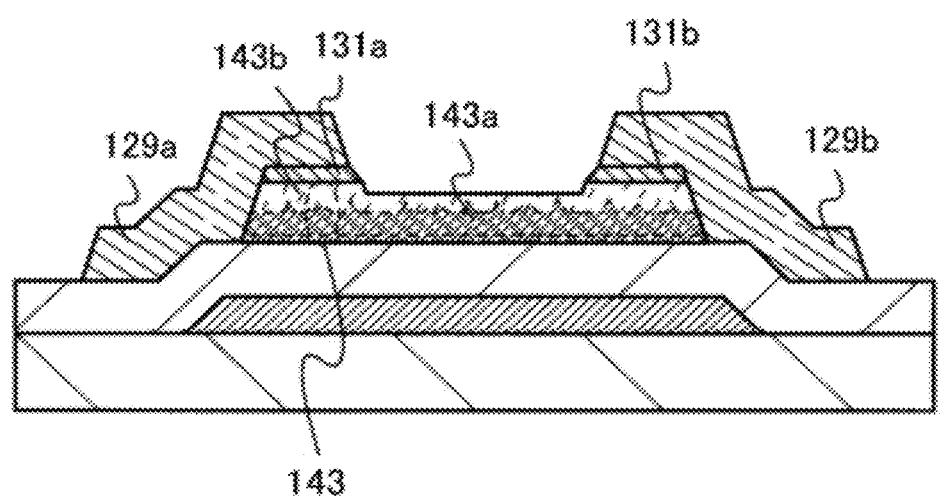
FIG. 6 is a cross-sectional view illustrating a manufacturing method of a thin film transistor formed in a semiconductor device of one embodiment of the present invention.

In this embodiment, a manufacturing method of a thin film transistor formed in the semiconductor device that is an embodiment of the present invention will be described with reference to FIG. 6. FIG. 6 corresponds to the step illustrated in FIG. 5B.

In a manner similar to that of Embodiment 3, a conductive film 127 is formed through the process of FIGS. 3A to 3D and FIG. 5A.

Then, as illustrated in FIG. 6, wirings 129a and 129b are formed and an impurity silicon film 121 and a silicon stacked body 117 are partly etched, so that a pair of impurity silicon films 131a and 131b serving as a source region and a drain region are formed in a manner similar to that of Embodiment 3. A silicon stacked body 143 including a microcrystalline silicon region 143a and an amorphous silicon region 143b is formed. At this time, the silicon stacked body 117 is etched so as to expose the amorphous region 143b, so that the silicon stacked body 143 is formed in which the microcrystalline silicon region 143a and the amorphous silicon region 143b are stacked in regions covered with the wiring 129a or 129b and the microcrystalline silicon region 143a is not exposed and the amorphous silicon region 143b is exposed in a region covered with neither the wiring 129a nor the wiring 129b and overlapping with the gate electrode. Note that the etching amount of the silicon stacked body 117 is smaller than that in the case of FIG. 5B.

A later process is similar to that of Embodiment 3. Through the above-described process, a single-gate thin film transistor can be manufactured. Since the back channel side of the thin film transistor is amorphous, the off-state current can be reduced as compared to the thin film transistor illustrated in FIG. 5B.

Figure 5C:
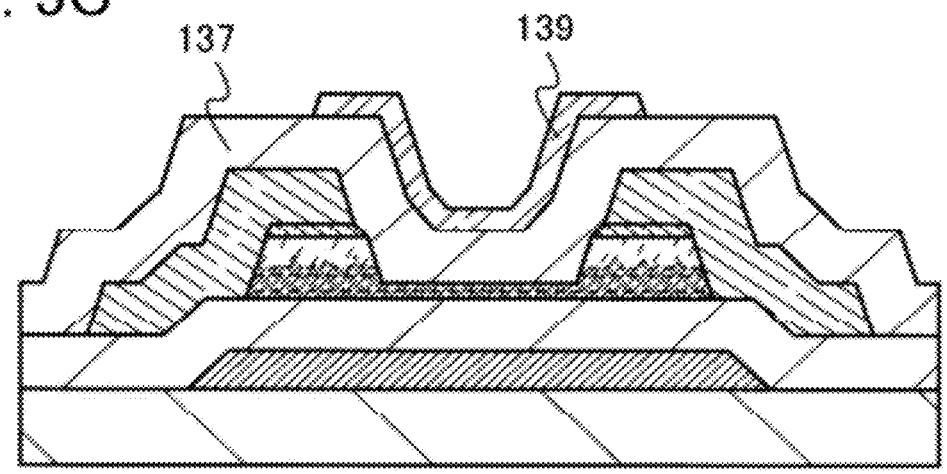

Further in this embodiment, after the step illustrated in FIG. 6, a back gate electrode 139 may be formed over an insulating film 137 as in the step illustrated in FIG. 5C or may not be formed.

Example

Figure 7:
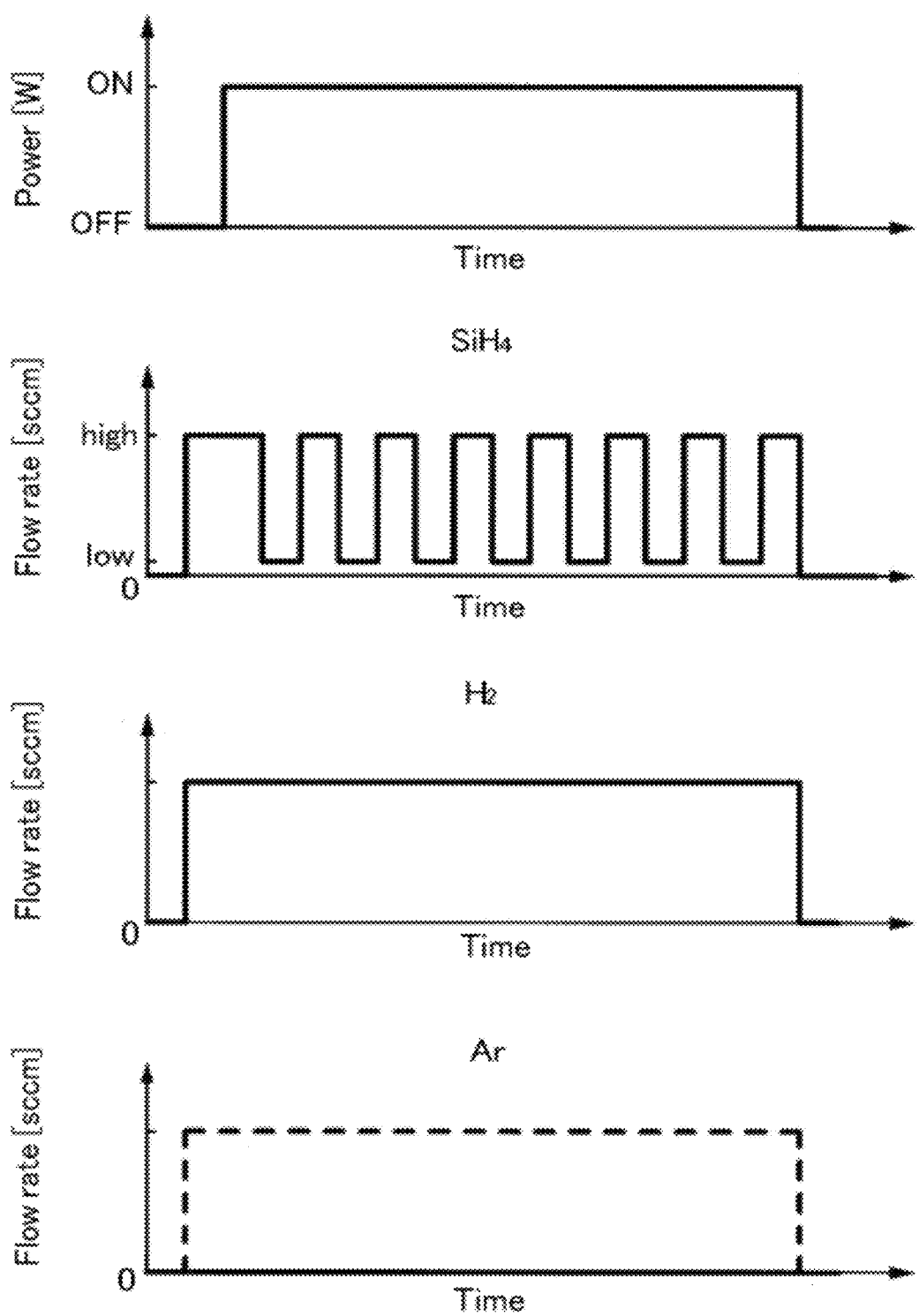
FIG. 7 is a conceptual diagram showing a supplying method of a source gas ($SiH_4$ cycle flow) under a first condition at the time of forming a first microcrystalline silicon film 57 illustrated in FIGS. 1A and 1B.

A manufacturing method of a microcrystalline silicon film according to this example will be described with reference to FIGS. 1A and 1B and FIG. 7. FIG. 7 is a conceptual diagram showing a supplying method of a source gas under the first condition at the time of forming the first microcrystalline silicon film 57 illustrated in FIGS. 1A and 1B.

The supplying method of a source gas in FIG. 7 is a so-called $SiH_4$ cycle flow film formation method. Although there is also a film formation method of a microcrystalline silicon film in which $SiH_4$, $H_2$, and Ar gasses are made to flow continuously during application of RF power, this example employs the $SiH_4$ cycle flow film formation method in which only the flow rate of $SiH_4$ gas is regularly changed at certain intervals.

First, a $SiN_x$ film with a thickness of 300 nm was formed to form the insulating film 55 over a glass substrate by a plasma CVD method as illustrated in FIG. 1A.

Next, plasma treatment with the use of dinitrogen monoxide ($N_2O$) was performed on the insulating film 55 for 180 seconds.

Then, the first microcrystalline silicon film 57 which includes the mixed phase grains 57a including silicon crystallites and amorphous silicon was formed over the insulating film 55 using a plasma CVD method. The $SiH_4$ cycle flow film formation method was used for Sample 1, and a film formation method in which $SiH_4$, $H_2$, and Ar gasses are made to flow continuously was used for Sample 2 that is a comparative example.

Details of the film formation method of the first microcrystalline silicon film of Sample 1 is as follows (1st step). The microcrystalline silicon film of Sample 1 was formed with a thickness of 5 nm under the first condition using the $SiH_4$ cycle flow film formation method.

In the first condition for depositing the microcrystalline silicon film of Sample 1, a plasma CVD method was used in which plasma discharge was performed by introducing $SiH_4$ in such a manner as to change the flow rate of $SiH_4$ to alternate between a high flow rate (5 sccm) and a low flow rate (0.1 sccm) every 5 seconds as shown in FIG. 7 and introducing $H_2$ and Ar at flow rates of 750 sccm and 750 sccm respectively as a source gas, and setting the pressure inside a treatment chamber at 532 Pa, the RF power source frequency at 13.56 MHz, and the power of the RF power at 150 W. Note that for the deposition of the microcrystalline silicon film, a parallel-plate plasma treatment apparatus was used with the upper electrode temperature and the lower electrode temperature set at 250° C. and 290° C. respectively, the gap between the upper and lower electrodes set at 15 mm, and the film deposition time set at 50 seconds. Thus, the first microcrystalline silicon film 57 including the mixed phase grains 57a was formed over the insulating film 55 (FIG. 1A).

A detailed film formation method of the first microcrystalline silicon film of Sample 2 is as follows. The microcrystalline silicon film of Sample 2 was formed with a thickness of 5 nm under the first condition using the film formation method in which $SiH_4$, $H_2$, and Ar gasses are made to flow continuously.

The first condition for depositing the microcrystalline silicon film of Sample 2 was a condition in which plasma discharge was performed in a plasma CVD method by introducing $SiH_4$, $H_2$, and Ar as a source gas at flow rates of 4 sccm, 750 sccm, and 750 sccm respectively, and setting the pressure inside a treatment chamber at 532 Pa, the RF power source frequency at 13.56 MHz, and the power of the RF power at 150 W. Note that for the deposition of the microcrystalline silicon film, a parallel-plate plasma treatment apparatus was used with the upper electrode temperature and the lower electrode temperature set at 250° C. and 290° C. respectively, the gap between the upper and lower electrodes set at 15 mm, and the film deposition time set at 27 seconds. Thus, the first microcrystalline silicon film 57 including the mixed phase grains 57a was formed over the insulating film 55 (FIG. 1A).

Figures 8A, 8B:
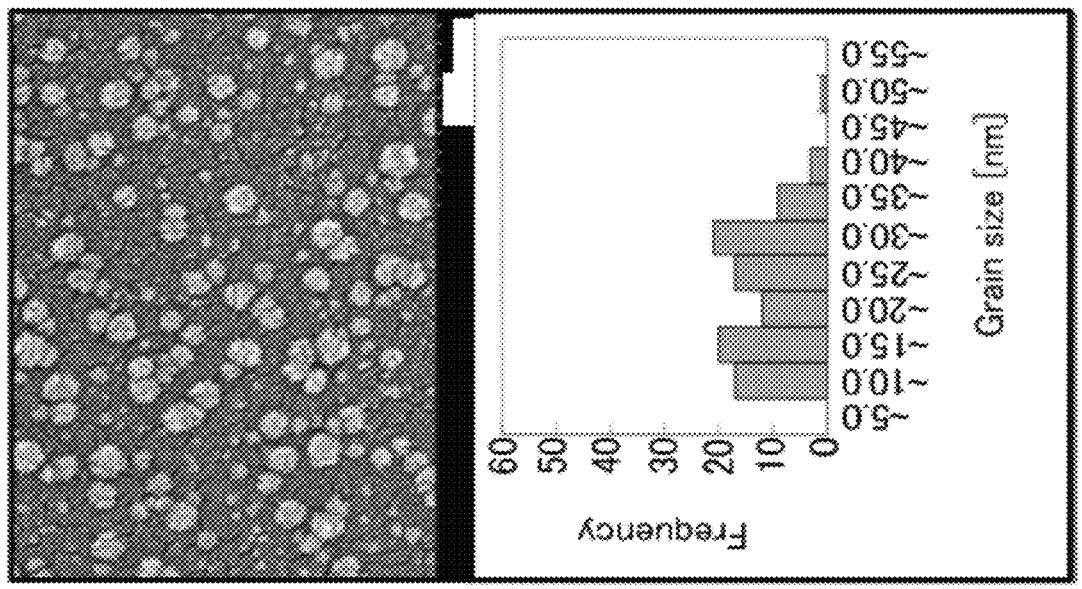
FIG. 8A is a SEM photograph of a first microcrystalline silicon film of Sample 1.
FIG. 8B is a SEM photograph of a first microcrystalline silicon film of Sample 2.

Next, the first microcrystalline silicon film of each of Sample 1 and Sample 2 was photographed with a scanning electron microscope, and the SEM photographs are shown in FIGS. 8A and 8B. FIG. 8A is a SEM photograph of Sample 1, and FIG. 8B is a SEM photograph of Sample 2.

When the SEM photograph of Sample 1 in FIG. 8A and the SEM photograph of Sample 2 in FIG. 8B are compared, it is found that the grain sizes of the mixed phase grains 57a in Sample 1, for which the $SiH_4$ cycle flow film formation method was used, are relatively uniform as compared to those in Sample 2, for which the film formation method in which $SiH_4$, $H_2$, and Ar gasses are made to flow continuously (normal film formation) was used. The reason for this is as follows. During the supply of $SiH_4$ at a high flow rate, the mixed phase grains 57a that have already been deposited over the insulating film 55 are enlarged and new mixed phase grains 57a are produced over the insulating film 55. During the supply of $SiH_4$ at a low flow rate, the small mixed phase grains 57a that have just been generated are removed by etching but the relatively large mixed phase grains 57a that have already been deposited over the insulating film 55 are left. By the repetition of the growth and the etching, the mixed phase grains with small grain sizes are reduced. Accordingly, the first microcrystalline silicon film 57 including many mixed phase grains 57a having highly uniform grain sizes can be obtained.

Figures 8C, 8D:
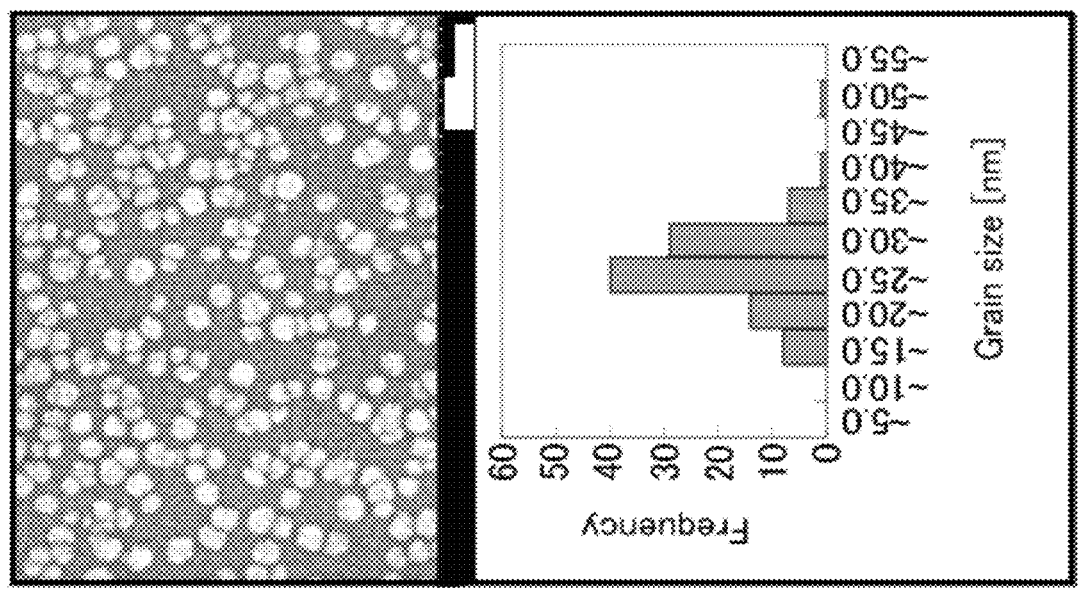
FIG. 8C is a histogram showing a relation between the grain size and the frequency of mixed phase grains of the first microcrystalline silicon film of Sample 1.
FIG. 8D is a histogram showing a relation between the grain size and the frequency of mixed phase grains of the first microcrystalline silicon film of Sample 2.

FIGS. 8C and 8D are histograms obtained by measuring the grain sizes of arbitrary 100 mixed phase grains in the SEM photograph of Sample 1 in FIG. 8A and those of arbitrary 100 mixed phase grains in the SEM photograph of Sample 2 in FIG. 8B.

According to the histograms of FIGS. 8C and 8D, it can be noticed that variation in the grain size of the mixed phase grains in Sample 1 (the cycle flow film formation) in FIG. 8C is smaller than in Sample 2 (normal film formation) in FIG. 8D.

Then, as illustrated in FIG. 1B, the second microcrystalline silicon film 59 which includes mixed phase grains including silicon crystallites and amorphous silicon was formed over the first microcrystalline silicon film 57 using a plasma CVD method. Here, the same film formation method was used for Sample 1 and Sample 2.

A detailed film formation method of the second microcrystalline silicon film is as follows (2nd step). The microcrystalline silicon film of each of Sample 1 and Sample 2 was formed with a thickness of 25 nm under the second condition using the film formation method in which $SiH_4$, $H_2$, and Ar gasses are made to flow continuously.

The second condition was a condition in which plasma discharge was performed in a plasma CVD method by introducing $SiH_4$, $H_2$, and Ar as a source gas at flow rates of 2 sccm, 1500 sccm, and 1500 sccm respectively, and setting the pressure inside a treatment chamber at 10 kPa, the RF power source frequency at 13.56 MHz, and the power of the RF power at 350 W. Note that for the deposition of the microcrystalline silicon film, a parallel-plate plasma treatment apparatus was used with the upper electrode temperature and the lower electrode temperature set at 250° C. and 290° C. respectively, and the gap between the upper and lower electrodes set at 15 mm. Thus, the second microcrystalline silicon film 59 was formed over the first microcrystalline silicon film 57 (FIG. 1B).

Next, the second microcrystalline silicon film of each of Sample 1 and Sample 2 was photographed with a scanning electron microscope, and the SEM photographs are shown in FIGS. 9A and 9B. FIG. 9A is a SEM photograph of Sample 1, and FIG. 9B is a SEM photograph of Sample 2.

When the SEM photograph of Sample 1 in FIG. 9A and the SEM photograph of Sample 2 in FIG. 9B are compared, it is found that the second microcrystalline silicon film of Sample 1 has larger and more uniform grain size than that of Sample 2.

In order to increase the film density after the formation of the second microcrystalline silicon film 59, it is preferable to control the density of the mixed phase grains 57a of the first microcrystalline silicon film 57 to be an appropriate value. If there are too many mixed phase grains 57a in the first microcrystalline silicon film, the grain sizes of the mixed phase grains 57a become small; on the other hand, if there are too few mixed phase grains 57a in the first microcrystalline silicon film, the space between the mixed phase grains 57a is difficult to fill with the second microcrystalline silicon film even when the grain size of the mixed phase grains 57a becomes larger. The high flow rate of $SiH_4$ at the time of forming the first microcrystalline silicon film 57 is preferably 4.5 sccm to 5.5 sccm although it depends somewhat on the film formation condition of the second microcrystalline silicon film.

According to this example, formation of the first microcrystalline silicon film 57 by the $SiH_4$ cycle flow film formation method can reduce variation in the grain sizes of the mixed phase grains 57a, whereby the grain sizes after the formation of the second microcrystalline silicon film 59 can become large and uniform.

This application is based on Japanese Patent Application serial no. 2010-235723 filed with Japan Patent Office on Oct. 20, 2010, the entire contents of which are hereby incorporated by reference.

What is claimed is:

1. A manufacturing method of a microcrystalline silicon film comprising the steps of:
    forming a first microcrystalline silicon film over an insulating film by a first plasma CVD method, under a first condition by alternately supplying a first supply gas including a first deposition gas and first hydrogen, and a second supply gas including a second deposition gas and second hydrogen; and
    forming a second microcrystalline silicon film over the first microcrystalline silicon film by a second plasma CVD method, under a second condition by supplying a third supply gas including a third deposition gas and third hydrogen,
    wherein the first microcrystalline silicon film comprises mixed phase grains comprising a silicon crystallite and amorphous silicon,
    wherein the first condition is a condition that a first treatment chamber is set to be higher than or equal to 67 Pa and lower than or equal to 1333 Pa, and the second condition is a condition that a second treatment chamber is set to be higher than or equal to 1333 Pa and lower than or equal to 13332 Pa,
    wherein a flow rate of the first hydrogen is greater than or equal to 50 times and less than or equal to 1000 times a flow rate of the first deposition gas,
    wherein a flow rate of the second deposition gas is less than the flow rate of the first deposition gas so as to primarily cause etching of silicon deposited over the insulating film rather than deposition of silicon over the insulating film, and
    wherein a flow rate of the third hydrogen is greater than or equal to 100 times and less than or equal to 2000 times a flow rate of the third deposition gas.

2. The manufacturing method of the microcrystalline silicon film according to claim 1, further comprising the step of:
    forming a third microcrystalline silicon film over the second microcrystalline silicon film by a third plasma CVD method, under a third condition by supplying a fourth supply gas including a fourth deposition gas and fourth hydrogen,
    wherein the third condition is a condition that a third treatment chamber is set to be higher than or equal to 1333 Pa and lower than or equal to 13332 Pa, and
    wherein a flow rate ratio of the fourth hydrogen to the fourth deposition gas is higher than a flow rate ratio of the third hydrogen to the third deposition gas.

3. The manufacturing method of the microcrystalline silicon film according to claim 1, wherein a rare gas is contained in at least one of the first supply gas to the third supply gas.

4. The manufacturing method of the microcrystalline silicon film according to claim 2, wherein a rare gas is contained in at least one of the first supply gas to the fourth supply gas.

5. The manufacturing method of the microcrystalline silicon film according to claim 1, wherein a crystallinity of the mixed phase grains is set to be higher by the first condition than the second condition.

6. The manufacturing method of the microcrystalline silicon film according to claim 1, wherein a crystal growth rate of the mixed phase grains in the first condition is higher than a crystal growth rate of the mixed phase grains in the second condition.

7. The manufacturing method of the microcrystalline silicon film according to claim 1, wherein the flow rate of the second deposition gas is higher than or equal to 0 sccm.

8. The manufacturing method of the microcrystalline silicon film according to claim 1, wherein the second microcrystalline silicon film fills a space between the mixed phase grains of the first microcrystalline silicon film.

9. A manufacturing method of a semiconductor device comprising the steps of:
    forming a gate electrode over a substrate;
    forming a gate insulating film over the gate electrode;
    forming a first microcrystalline silicon film over the gate insulating film by a first plasma CVD method, under a first condition by alternately supplying a first supply gas including a first deposition gas and first hydrogen, and a second supply gas including a second deposition gas and second hydrogen;
    forming a second microcrystalline silicon film over the first microcrystalline silicon film by a second plasma CVD method, under a second condition by supplying a third supply gas including a third deposition gas and third hydrogen; and
    forming a source region and a drain region over the second microcrystalline silicon film,
    wherein the first microcrystalline silicon film comprises mixed phase grains comprising a silicon crystallite and amorphous silicon, wherein the first condition is a condition that a first treatment chamber is set to be higher than or equal to 67 Pa and lower than or equal to 1333 Pa, and the second condition is a condition that a second treatment chamber is set to be higher than or equal to 1333 Pa and lower than or equal to 13332 Pa, wherein a flow rate of the first hydrogen is greater than or equal to 50 times and less than or equal to 1000 times a flow rate of the first deposition gas, wherein a flow rate of the second deposition gas is less than the flow rate of the first deposition gas so as to primarily cause etching of silicon deposited over the gate insulating film rather than deposition of silicon over the gate insulating film, and wherein a flow rate of the third hydrogen is greater than or equal to 100 times and less than or equal to 2000 times a flow rate of the third deposition gas.

10. The manufacturing method of the semiconductor device according to claim 9, further comprising the step of:

forming a third microcrystalline silicon film over the second microcrystalline silicon film by a third plasma CVD method, under a third condition by supplying a fourth supply gas including a fourth deposition gas and fourth hydrogen before forming the source region and the drain region, wherein the third condition is a condition that a third treatment chamber is set to be higher than or equal to 1333 Pa and lower than or equal to 13332 Pa, and wherein a flow rate ratio of the fourth hydrogen to the fourth deposition gas is higher than a flow rate ratio of the third hydrogen to the third deposition gas.

11. The manufacturing method of the semiconductor device according to claim 9, wherein a rare gas is contained in at least one of the first supply gas to the third supply gas.

12. The manufacturing method of the semiconductor device according to claim 10, wherein a rare gas is contained in at least one of the first supply gas to the fourth supply gas.

13. The manufacturing method of the semiconductor device according to claim 9, wherein a crystallinity of the mixed phase grains is set to be higher by the first condition than the second condition.

14. The manufacturing method of the semiconductor device according to claim 9, wherein a crystal growth rate of the mixed phase grains in the first condition is higher than a crystal growth rate of the mixed phase grains in the second condition.

15. The manufacturing method of the semiconductor device according to claim 9, wherein the flow rate of the second deposition gas is higher than or equal to 0 sccm.

16. The manufacturing method of the semiconductor device according to claim 9, wherein the second microcrystalline silicon film fills a space between the mixed phase grains of the first microcrystalline silicon film.

17. The manufacturing method of the semiconductor device according to claim 9, further comprising the step of:

forming an impurity silicon film over the second microcrystalline silicon film before forming the source region and the drain region.

18. The manufacturing method of the semiconductor device according to claim 10, further comprising the step of:

forming an impurity silicon film over the third microcrystalline silicon film before forming the source region and the drain region.

* * * * *